(12) United States Patent
Daxer et al.

(10) Patent No.: US 11,281,195 B2
(45) Date of Patent: Mar. 22, 2022

(54) INTEGRATED CIRCUITS WITH IN-FIELD DIAGNOSTIC AND REPAIR CAPABILITIES

(71) Applicant: Intel Corporation, Santa Clara, CA (US)

(72) Inventors: Kenneth T. Daxer, Sunnyvale, CA (US); Gregory Steinke, Saratoga, CA (US); Adam J. Wright, Santa Clara, CA (US); Kalyana Ravindra Kantipudi, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 1007 days.

(21) Appl. No.: 15/720,539

(22) Filed: Sep. 29, 2017

(65) Prior Publication Data

US 2019/0101906 A1 Apr. 4, 2019

(51) Int. Cl.
*G11C 29/44* (2006.01)
*G05B 19/418* (2006.01)
*H03K 19/17764* (2020.01)

(52) U.S. Cl.
CPC .  *G05B 19/41875* (2013.01); *G05B 19/41805* (2013.01); *H03K 19/17764* (2013.01)

(58) Field of Classification Search
CPC ........ G05B 19/41875; G05B 19/41805; H03K 19/17764
See application file for complete search history.

(56) References Cited

U.S. PATENT DOCUMENTS

| | | | |
|---|---|---|---|
| 3,766,521 A | 10/1973 | Carter et al. | |
| 5,127,014 A | 6/1992 | Raynham | |
| 5,210,749 A | 5/1993 | Firoozmand | |
| 5,754,753 A | 5/1998 | Smelser | |
| 5,991,907 A * | 11/1999 | Stroud | G01R 31/318519 714/725 |
| 6,101,624 A * | 8/2000 | Cheng | G06F 11/1008 714/48 |
| 6,754,207 B1* | 6/2004 | Hesse | H04L 12/2854 370/388 |
| 7,277,346 B1* | 10/2007 | Rahim | G11C 17/18 326/10 |
| 7,328,377 B1 | 2/2008 | Lewis et al. | |

(Continued)

OTHER PUBLICATIONS

Donald P. Leach et al., "Digital Principles & Applications" In: "Digital Principles & Applications", 1995 Tata McGraw-Hill Education, XP055116330. p. 196.

(Continued)

*Primary Examiner* — Kurtis R Bahr

(57) ABSTRACT

An integrated circuit may include an embedded test processor that is capable of performing in-field testing and repair of hardware-related defects without having to remove the integrated circuit from the customer's board. The test processor can be used to drive and monitor test vectors to performing defect screening on input-output circuitry, logic circuitry including lookup table (LUT) circuits and digital signal processing (DSP) circuits, transceiver circuitry, and configuration random-access memory circuitry. The test processor can generate a failure mechanism report and selectively fix repairable defects via a hardware redundancy scheme. The failure mechanism report allows the customer to identify the root cause of failure in the overall system.

20 Claims, 5 Drawing Sheets

(56) References Cited

U.S. PATENT DOCUMENTS

| | | | |
|---|---|---|---|
| 7,447,950 B2* | 11/2008 | Takahashi | G06F 11/1008 |
| | | | 365/200 |
| 7,565,597 B1 | 7/2009 | Branth et al. | |
| 7,594,002 B1 | 9/2009 | Thorpe et al. | |
| 7,869,355 B2 | 1/2011 | Kodama et al. | |
| 8,229,918 B2 | 7/2012 | Branscome et al. | |
| 8,369,175 B1 | 2/2013 | Liu et al. | |
| 8,612,814 B1 | 12/2013 | Tan et al. | |
| 8,984,367 B2 | 3/2015 | Ekas et al. | |
| 9,081,062 B1 | 7/2015 | Pedersen | |
| 2001/0010084 A1 | 7/2001 | Lin et al. | |
| 2002/0133773 A1* | 9/2002 | Richter | G01R 31/318533 |
| | | | 714/733 |
| 2003/0156454 A1 | 8/2003 | Wei et al. | |
| 2004/0030976 A1* | 2/2004 | Ghameshlu | G01R 31/318547 |
| | | | 714/732 |
| 2007/0019661 A1 | 1/2007 | Rowett et al. | |
| 2007/0061668 A1 | 3/2007 | Wickeraad et al. | |
| 2007/0135866 A1* | 6/2007 | Baker | H04L 67/28 |
| | | | 607/60 |
| 2007/0234101 A1 | 10/2007 | Koktan et al. | |
| 2008/0104601 A1 | 5/2008 | Kaneko et al. | |
| 2008/0109648 A1* | 5/2008 | Weiberle | G06F 11/1417 |
| | | | 713/2 |
| 2009/0282308 A1 | 11/2009 | Gutsche et al. | |
| 2010/0100779 A1 | 4/2010 | Morlya | |
| 2010/0218072 A1 | 8/2010 | Fukuyama et al. | |
| 2011/0099459 A1 | 4/2011 | Nakamura et al. | |
| 2016/0048458 A1 | 2/2016 | Lutas et al. | |
| 2016/0093401 A1* | 3/2016 | Chang | G11C 29/4401 |
| | | | 365/201 |
| 2016/0284424 A1* | 9/2016 | Das | G11C 29/52 |
| 2017/0039103 A1* | 2/2017 | Engin | G11C 29/52 |
| 2018/0047458 A1* | 2/2018 | Bucksch | G11C 29/38 |

OTHER PUBLICATIONS

Thornwood, "Dynamic Switch to Data Slow Mode on a Memory Card", IBM Technical Disclosure Bulletin, International Business Machines Corp, vol. 37, No. 2A, p. 321, Feb. 1, 1994.
Thornwood, "Memory Card Data Fastpath" IBM Technical Disclosure Bulletin, International Business Machines Corp, vol. 37, No. 2A, p. 637-638, Feb. 1, 1994.
Kantipudi, U.S. Appl. No. 15/485,543, filed Apr. 12, 2017.
Khor et al., U.S. Appl. No. 15/625,897, filed Jun. 16, 2017.

* cited by examiner

INTEGRATED CIRCUITS WITH IN-FIELD DIAGNOSTIC AND REPAIR CAPABILITIES

BACKGROUND

This relates to repairing integrated circuits and more particularly, to performing in-field defect repairs on a programmable integrated circuit.

A programmable integrated circuit typically includes thousands of configuration memory elements that store configuration data. The stored configuration data is used to configure programmable logic on the integrated circuit to perform a custom logic function, store data, or otherwise implement a user-specified design. Programmable integrated circuits are susceptible to reliability and electrical overstress failures such as oxide defects and electromigration, which can exacerbate over time.

Conventional methods for ensuring reliability involve screening for defects at the factory with the goal of minimizing failure rate. An integrated circuit that passes the factory screening is then shipped to a customer. The customer will then use the integrated circuit as part of a bigger system to carry out the desired application.

If, however, there is a system failure, there is no way for the customer to know whether the integrated circuit device is the root cause of the system failure. The customer will have to remove the device from the system, send suspecting failing units back to the factory, and wait for days or even weeks to confirm that the device is defective. Such removal, manual handling, and transport of the device between the customer and the factory can further damage the device.

It is within this context that the embodiments described herein arise.

DETAILED DESCRIPTION

The present embodiments relate to methods and circuitry configured to self-identify defects on a programmable integrated circuit and to perform selective in-field repair while the programmable integrated circuit is at the customer site (e.g., repair may be performed only if the defect is repairable). The programmable integrated circuit may be provided with a smart test processor such as a secure device manager that can be used to drive and monitor test vectors for various components on the integrated circuit.

It will be recognized by one skilled in the art, that the present exemplary embodiments may be practiced without some or all of these specific details. In other instances, well-known operations have not been described in detail in order not to unnecessarily obscure the present embodiments.

Figure 1:
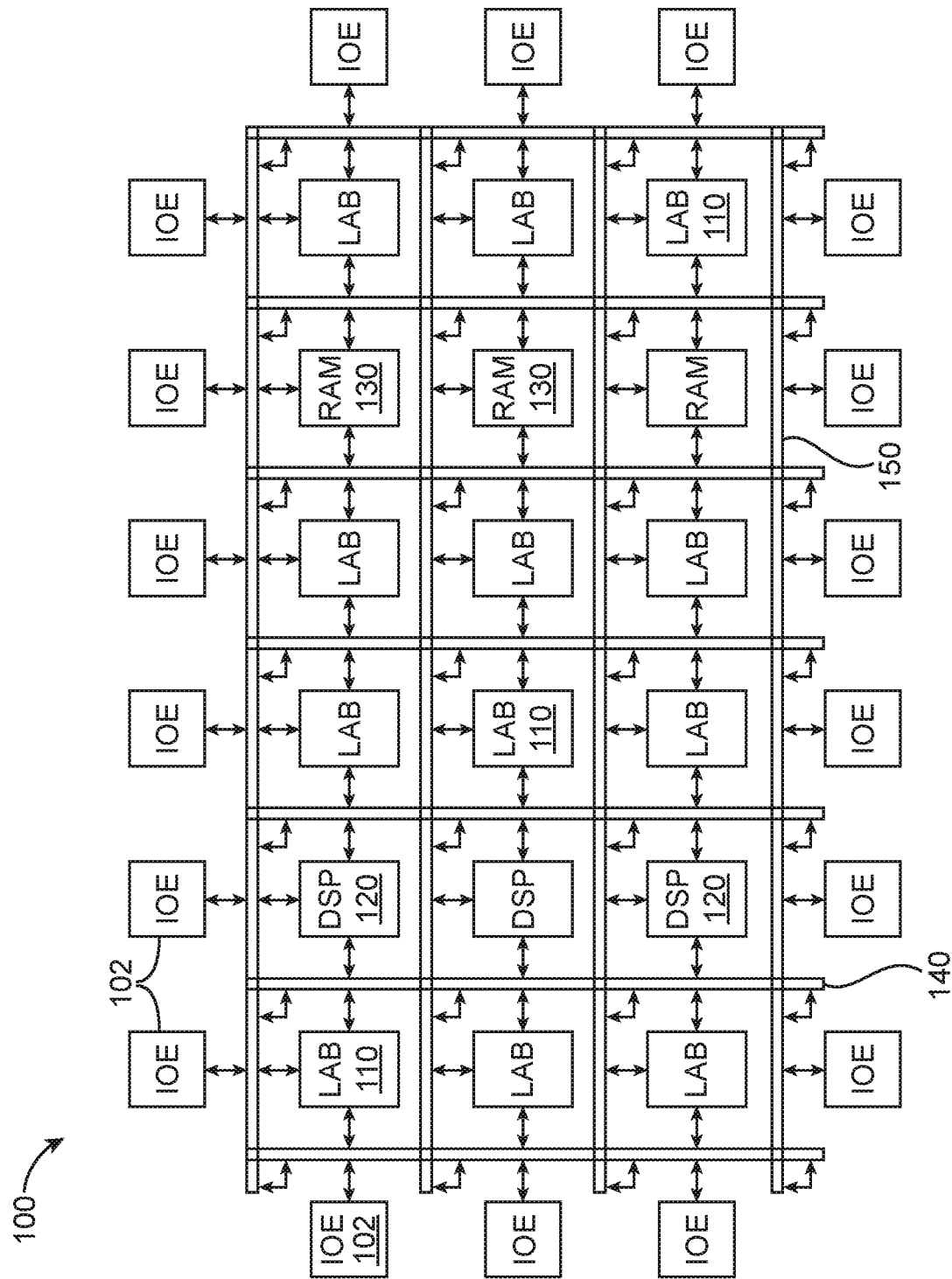
FIG. 1 is a diagram of an illustrative programmable integrated circuit in accordance with an embodiment.

An illustrative integrated circuit such as a programmable logic device (PLD) 100 is shown in FIG. 1. As shown in FIG. 1, PLD 100 may include a two-dimensional array of functional blocks, including logic array blocks (LABs) 110 and other associated functional blocks, such as random-access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce corresponding output signals.

Programmable device 100 may contain programmable memory elements. Memory elements may be loaded with configuration data (also called programming data) using input-output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

In addition, the programmable logic device may have input/output elements (IOEs) 102 for driving signals off of PLD and for receiving signals from other devices. Input/output elements 102 may include parallel input/output circuitry, serial data transceiver circuitry, differential receiver and transmitter circuitry, or other circuitry used to connect one integrated circuit to another integrated circuit.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that the embodiments described herein may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
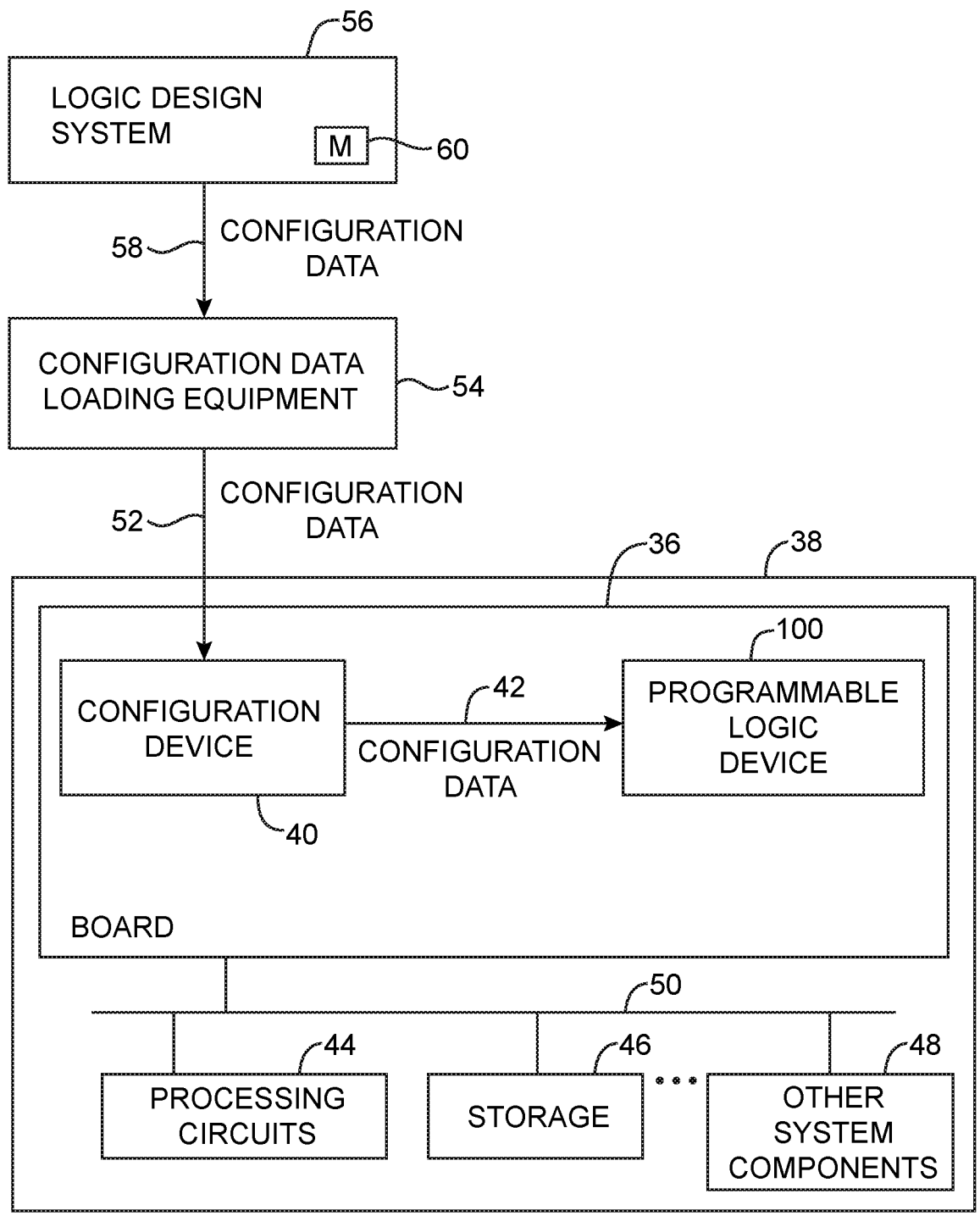
FIG. 2 is a diagram showing how configuration data is created by a logic design system and loaded into a programmable device to configure the device for operation in a system in accordance with an embodiment.

An illustrative system environment for device 100 is shown in FIG. 2. Device 100 may be mounted on a board 36 in a system 38. In general, programmable logic device 100 may receive configuration data from programming equipment or from other suitable equipment or device. In the example of FIG. 2, programmable logic device 100 is the type of programmable logic device that receives configuration data from an associated integrated circuit 40. With this type of arrangement, circuit 40 may, if desired, be mounted on the same board 36 as programmable logic device 10.

Circuit 40 may be an erasable-programmable read-only memory (EPROM) chip, a programmable logic device configuration data loading chip with built-in memory (sometimes referred to as a "configuration device"), or another suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements.

System 38 may include processing circuits 44, storage 46, and other system components 48 that communicate with device 100. The components of system 38 may be located on one or more boards such as board 36 or other suitable mounting structures or housings and may be interconnected by buses, traces, and other electrical paths 50.

Configuration device 40 may be supplied with the configuration data for device 100 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 100 over path 42. Logic design system 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data, which is provided to configuration device 40. Upon power-up, configuration device 40 and data loading circuitry on programmable logic device 100 is used to load the configuration data into CRAM cells of device 100. Device 100 may then be used in normal operation of system 38.

After device 100 is initially loaded with a set of configuration data (e.g., using configuration device 40), device 100 may be reconfigured by loading a different set of configuration data. Sometimes it may be desirable to reconfigure only a portion of the memory cells on device 100 via a process sometimes referred to as "partial reconfiguration." As memory cells are typically arranged in an array, partial reconfiguration can be performed by writing new data values only into selected portion(s) in the array while leaving portions of array other than the selected portion(s) in their original state.

Figure 3:
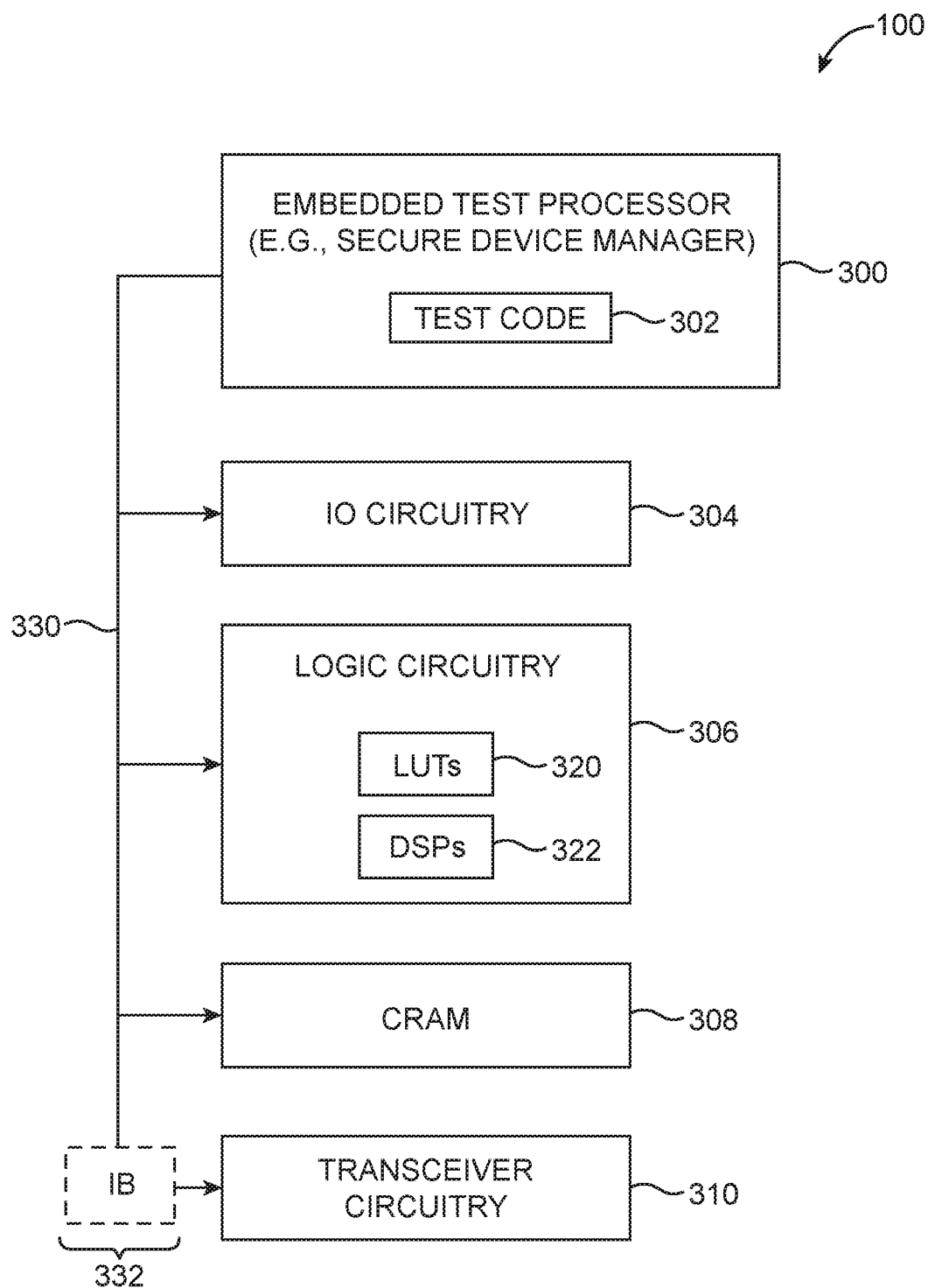
FIG. 3 is a diagram of an integrated circuit that includes a test processor configured to perform in-field defect screening and repair in accordance with an embodiment.

In the example of FIG. 2, device 100 may be installed as part of system 38 at a customer site. While defect screening is performed at the factory before shipping device 100 to the customer, certain instances of device 100 can and are expected to exhibit failures over time. FIG. 3 is a diagram of an integrated circuit that includes a test processor configured to perform in-field defect screening and repair in accordance with an embodiment. As shown in FIG. 3, device 100 may include an embedded test processor such as processor 300 that is coupled to IO circuitry 304, logic circuitry 306, CRAM circuitry 308, and optionally transceiver circuitry 310 via control path 330.

Processor 300 may be a secure device manager (SDM) that serves as a standalone test master controller for generating commands, configuration data, and other control signals to the various interconnected components via path 330 (e.g., processor 300 can source/create test vectors without receiving test signals or other control signals from an external test host). Processor 300 may also be configured to run a test code 302 for monitoring/testing for defects on device 100 and for selectively fixing any defects in the field without requiring the customer to send device 100 back to the factory (e.g., device 100 may be repaired while on the customer board at the customer site). By screening and repairing defects in the field, substantial system downtime can be avoided. If desired, processor 300 may also be configured to decompress and decrypt data received from off-chip components.

Processor 300 may be configured to perform these operations using hardware (e.g., dedicated hardware or circuitry), firmware, and/or software. Software code for performing these operations is stored on non-transitory computer readable storage media (e.g., tangible computer readable storage media). The software code may sometimes be referred to as software, data, program instructions, instructions, or code (e.g., test code 302). The non-transitory computer readable storage media may include non-volatile memory such as non-volatile random-access memory (NVRAM), one or more hard drives (e.g., magnetic drives or solid-state drives), one or more removable flash drives or other removable media, or the like. Software stored on the non-transitory computer readable storage media may be executed on processing circuitry 300.

Processor 300 may be used to perform algorithm-based testing on IO circuitry 304. IO circuitry 304 may represent IO elements 102 (FIG. 1), input-output device pins, and other external interfacing circuitry on device 100. For example, processor 300 may generate test commands (e.g., a Joint Test Action Group or "JTAG" command) to perform boundary scanning by scanning in a series of zeros and/or ones into boundary scan register circuitry coupled to IO elements 102. JTAG boundary scanning operations may be capable of detecting certain static faults (e.g., short circuits, open circuits, and other logic errors) that may be present in IO circuitry 304.

Defects detected in IO circuitry 304 are generally unrepairable. Thus, when such defects are detected, a corresponding error flag indicative of this type of error may be asserted to alert the user, and the user can then decide to take appropriate action to address that defect.

Processor 300 may also be used to perform functional tests on logic circuitry 306. Logic circuitry 306 may include lookup table (LUT) circuits 320 (which may be part of LAB 110 in FIG. 1), DSP blocks 322 (see also DSP blocks 120 in FIG. 1), and other programmable or nonprogrammable circuitry on device 100. For example, processor 300 may engage built-in self-test (BIST) circuitry such as linear feedback shift register (LFSR) circuits and multiple input signature registers (MISR) circuits to detect defects in DSP blocks 322, LUT circuits 320, and other programmable circuitry on device 100.

Defects/faults detected in logic circuitry 306 are generally repairable. Thus, when such defects are detected, redundant circuitry may be switched into use to bypass the defective logic portion. In scenarios where the logic circuits are organized into multiple rows, a row that includes a fault may be switched out of use while switching into use a previously unused row. In scenarios where the logic circuits are grouped into blocks, a block that includes a defect may be disabled and bypassed while engaging a redundant block that is previously unused.

Processor 300 may also be configured to identify defects in configuration memory 308, which may be part of RAM circuitry 130 in FIG. 1. For example, processor 300 may load a test pattern and associated precomputed check bits into memory 308 and may direct an existing localized error detection cyclic redundancy check (EDCRC) mechanism to detect manufacturing defects in memory 308 (e.g., by dynamically computing signatures for each memory frame and then comparing the signatures to the precomputed check bits).

Defects/faults detected in configuration memory 308 are generally repairable. Thus, when such defects are detected, redundant circuitry may be switched into use to bypass the defective memory portion. In scenarios where the memory circuits are organized into an array having multiple rows, a row that includes at least one defective CRAM cell may be switched out of use while switching into use a previously unused row of CRAM memory cells. If desired, CRAM and associated logic circuitry might be jointly or separately repaired if defects are detected.

Processor 300 may also be configured to detect defects in transceiver circuitry 310. Transceiver circuitry 310 may represent an interface circuit specifically designed to support a particular Internet Protocol (IP) communications standard such as the Ethernet protocol, PCIe (Peripheral Component Interconnect Express) protocol, HBM (High Bandwidth Memory) protocol, or other component interfacing standards. For example, processor 300 may generate a pseudo-random bit sequence (PRBS) when testing transceiver 310. In some embodiments, transceiver 310 may be formed on-chip. In other embodiments, transceiver 310 may be formed off-chip. In such scenarios, device 100 and transceiver 310 may be mounted on a common interposer and may communicate with one another via an interconnect bridge 332 that is embedded in the interposer.

Defects detected within transceiver circuitry 310 are generally unrepairable. Thus, when such defects are detected, a corresponding error flag indicative of this type of error may be asserted to alert the user, and the user can then decide to take appropriate action to address that defect. If, however, the transceiver malfunction is caused by a defect in interconnect bridge 332 and not the transceiver itself, redundant circuitry within interconnect bridge 332 may be engaged to switch out or bypass one or more defective signal conductor paths.

Figure 4:
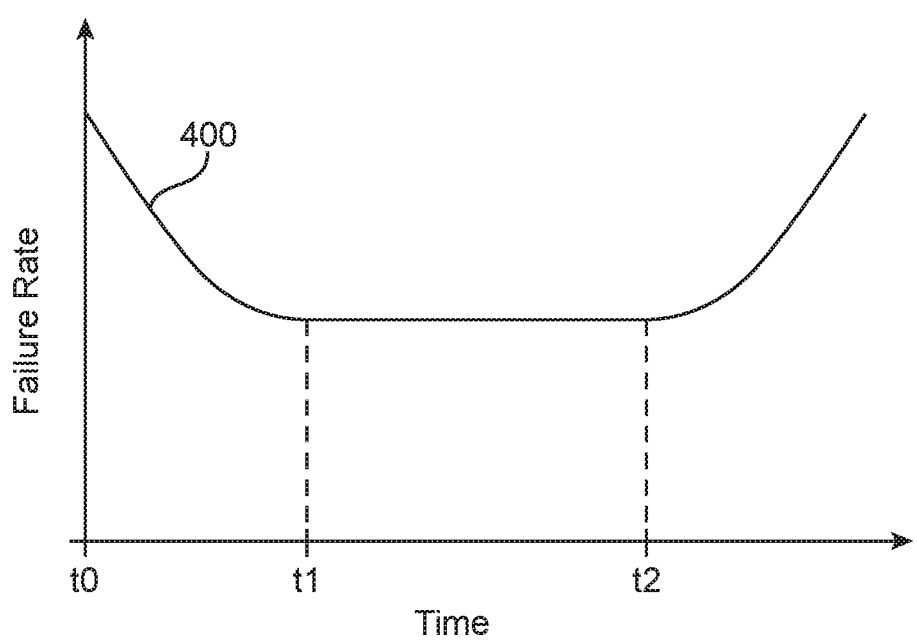
FIG. 4 is a plot showing an observed failure rate over time.

The various types of hardware failures described above may manifest themselves at different times over the life of device 100. Since hardware defects and other reliability issues can arise as device 100 ages, it is generally desirable to perform in-field testing on a periodic basis (e.g., upon device powerup, once a day, once per week, once per month, once per quarter, once per year, etc.). FIG. 4 is a plot showing an observed failure rate over time. Curve 400 represents the observed failure rate as a function of time.

Time t0 is when device 100 is first manufactured at the factory. From time t0 to time t1, device 100 may exhibit a decreasing failure rate due to falling "infant mortality" failure rates associated with defects that tend to abate over time. From time t1 to t2, device 100 may exhibit a relatively constant failure rate due to random failures that can surface at any time throughout the lifetime of device 100. After time t2, device 100 may exhibit an increasing failure rate due to aging-related defects such as thin-oxide breakdown, electromigration, negative-bias temperature instability (NBTI), hot-carrier injection (HCI), etc. The frequency at which in-field testing and repair is performed may be proportional to the expected failure rate profile 400 (e.g., in-field diagnostic/repair should be performed more frequently during times when failure rates are expected to be elevated such as before time t1 and after time t2).

Figure 5:
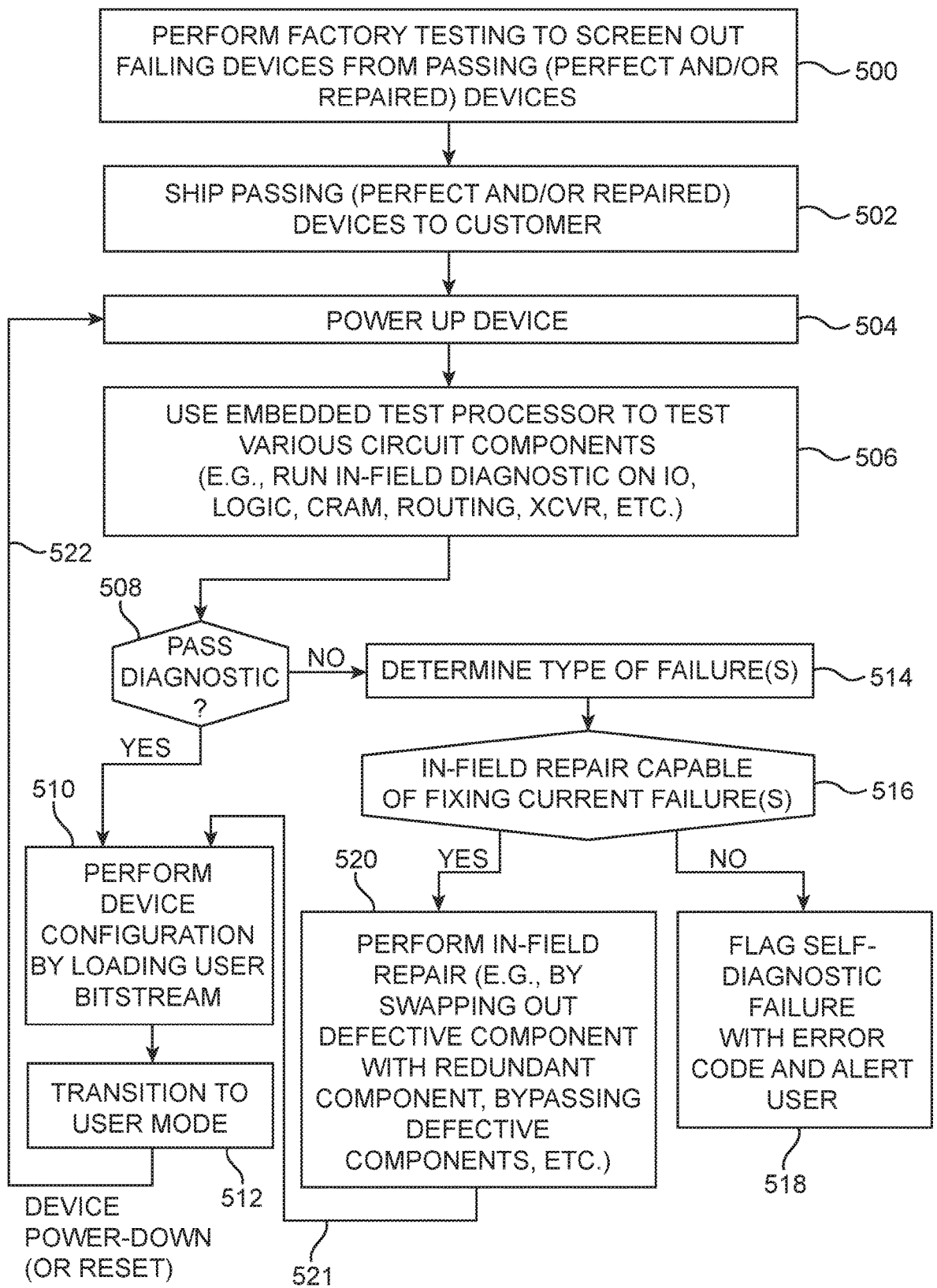
FIG. 5 is a flow chart of illustrative steps for performing in-field screening and repair in accordance with an embodiment.

FIG. 5 is a flow chart of illustrative steps for performing in-field screening and repair. At step 500, device 100 may be tested at the factory of the manufacturer to screen out failing devices from passing devices. If a defect is detected at this stage, device 100 may be repaired. If the defect cannot be fixed, device 100 may be discarded or otherwise disposed of. Passing devices (i.e., perfect and/or repaired) devices will then be shipped to the customer (step 502).

Device 100 may be received at the customer site, installed into the customer's system, and then be powered up (step 504). At step 506, embedded test processor 300 may then perform in-field testing the various circuit components on device 100 to discover any potential hardware or silicon faults while device 100 is installed in customer's system (e.g., to diagnose or debug device 100 to isolate the root cause of failure). For example, processor 300 may be configured to run in-field diagnostic on IO circuitry 304, logic circuitry 306, configuration memory circuitry 308, transceiver circuitry 310, and/or other configurable or non-configurable circuitry on device 100 (see FIG. 3).

At step 508, processor 300 may analyze the test results collected during step 506 to determine whether device 100 passes diagnostic. If the test results pass diagnostic, device configuration may be performed by loading the user configuration bitstream onto device 100 at step 510 (e.g., configuration data may be loaded into device 100 to implement the desired custom user function). Once device configuration is complete, device 100 may transition to user mode to perform the desired logic function (step 512). Processing may then loop back to step 504 whenever device 100 power cycles, as indicated by path 522.

If the test results do not pass diagnostic, processor 300 may determine the type of failure at step 514. Processor 300 may be configured to compile a failure mechanism report displaying one or more failure mechanism codes depending on the type of failure that has been detected. For example, the failure report may list a first code if no defects are found, a second code indicative of some type of electrical overstress (e.g., damage caused by oxide breakdown, electromigration, etc.), a third code indicative of some type of fabrication or processing defect (e.g., an inadvertent short or open circuit between adjacent metal wires), a fourth code indicative of delamination of one or more layers in device 100, a fifth code indicative of a package-level defect, a sixth code indicative of some type of factory error, a seventh code indicative of some type of programming or software error, an eighth code indicative of electrostatic discharge at the input-output pins, a ninth code indicative of a memory or CRAM defect, a tenth node indicative of a defect in a DSP block, an eleventh code indicative of some type of input-output (IO) or high-speed interface error, etc. If desired, the code may also include information regarding the location of the detected error/defect.

At step 516, processor 300 may then determine whether the detected type of failure is capable of being repaired. If the detected fault is unrepairable, processor 300 may assert a self-diagnostic failure flag, output a failure mechanism report with the corresponding error code, and alert the user so that the user can take appropriate action (step 518). If the detected fault is repairable, processor 300 may initiate in-field repair at step 520 (e.g., by swapping out the defective component with a redundant component, by bypassing one or more defective components, etc.). Processing may then loop to step 510 to perform device configuration, as indicated by path 521.

These steps are merely illustrative and are not intended to limit the present embodiments. The existing steps may be modified or omitted; some of the steps may be performed in parallel; additional steps may be added; and the order of certain steps may be reversed or altered. In-field testing and repair may be performed as frequently as desired to ensure failure rates are kept below a desired threshold.

At least some of the embodiments described above relate to hardware redundancy. If desired, faulty resources may be repaired via software redundancy means to restore chip-level or system-level functionality. For example, a new configuration file which restores system function (but does not use the faulty resource) could instead be loaded. This would require generate multiple configuration files that provide the same functionality but with slightly different hardware implementations.

The embodiments above in which the in-field testing to detect hardware defects is performed using an on-chip test processor (e.g., test processor 300 on device 100) is merely illustrative. If desired, the in-field testing may be performed using an off-chip test host.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

EXAMPLES

The following examples pertain to further embodiments.

Example 1 is an integrated circuit, comprising: circuitry; and a test processor configured to perform in-field testing to detect hardware defects in the circuitry.

Example 2 is the integrated circuit of example 1, wherein the test processor optionally sources test vectors for testing the circuitry without receiving test signals from an external test host.

Example 3 is the integrated circuit of example 1, wherein the test processor is optionally further configured to selectively repair the detected hardware defects.

Example 4 is the integrated circuit of example 3, wherein the test processor optionally repairs the detected hardware defects by bypassing a defective component and switching into use a redundant component.

Example 5 is the integrated circuit of example 1, wherein the test processor optionally repairs the detected hardware defect via a software redundancy scheme.

Example 6 is the integrated circuit of any one of examples 1-5, wherein the test processor is optionally configured to identify the type of hardware defect and to generate a failure mechanism report listing the type of hardware defect that is detected.

Example 7 is the integrated circuit of any one of examples 1-5, wherein the circuitry optionally comprises input-output circuitry.

Example 8 is the integrated circuit of any one of examples 1-5, wherein the circuitry optionally comprises logic circuitry that includes lookup table circuits and digital signal processing circuits.

Example 9 is the integrated circuit of any one of examples 1-5, wherein the circuitry optionally comprises configuration memory.

Example 10 is the integrated circuit of any one of examples 1-5, wherein the circuitry optionally comprises transceiver circuitry.

Example 11 is a method of testing an integrated circuit, the method comprising: with a test processor, performing in-field testing to detect a hardware defect within the integrated circuit; and with the test processor, determining the type of hardware defect.

Example 12 is the method of example 11, further optionally comprising: in response to detecting the hardware defect within the integrated circuit, selectively repairing the detected hardware defect by engaging a hardware redundancy mechanism to bypass the detected hardware defect in response to determining that the type of hardware defect is repairable.

Example 13 is the method of example 11, further optionally comprising: in response to detecting the hardware defect within the integrated circuit, selectively repairing the detected hardware defect by engaging a software redundancy mechanism to restore system-level functionality by loading a new configuration file onto the integrated circuit.

Example 14 is the method of any one of examples 11-13, further optionally comprising: asserting a self-diagnostic failure flag in response to determining that the type of hardware defect is unrepairable.

Example 15 is the method of any one of examples 11-13, wherein the test processor is optionally either formed on the integrated circuit or external to the integrated circuit.

Example 16 is a non-transitory computer-readable storage medium comprising instructions for: detecting a hardware defect on an integrated circuit die; identifying the type of hardware defect; and generating a failure mechanism report listing the type of hardware defect that is detected.

Example 17 is the non-transitory computer-readable storage medium of example 16, wherein the instructions for detecting the hardware defect optionally comprise instructions for: directing an embedded test processor on an integrated circuit die to screen for hardware faults on the integrated circuit die; and selectively repairing the hardware faults.

Example 18 is the non-transitory computer-readable storage medium of example 17, wherein the instructions for directing the embedded test processor to screen for the hardware faults optionally comprise instructions for directing the embedded test processor to screen for hardware faults associated with input-output circuitry, logic circuitry, and memory circuitry on the integrated circuit die.

Example 19 is the non-transitory computer-readable storage medium of example 17, wherein the instructions for directing the embedded test processor to screen for hardware faults optionally comprise instructions for creating and monitoring test vectors on the integrated circuit die.

Example 20 is the non-transitory computer-readable storage medium of example 17, wherein the instructions for selectively repairing the hardware faults optionally comprise instructions for: determining whether the hardware faults are repairable; bypassing defective components while switching into use redundant components in response to determining that the hardware faults are repairable; and outputting an error alert in response to determining that the hardware faults are unrepairable.

Example 21 is an integrated circuit, comprising: means for performing in-field testing to detect a hardware defect within the integrated circuit; and means for determining the type of hardware defect.

Example 22 is the integrated circuit of example 21, further optionally comprising: means for selectively repairing the detected hardware defect by engaging a hardware redundancy mechanism to bypass the detected hardware defect in response to detecting the hardware defect within the integrated circuit.

Example 23 is the integrated circuit of example 21, further optionally comprising: means for selectively repairing the detected hardware defect by engaging a software redundancy mechanism to restore system-level functionality by loading a new configuration file onto the integrated circuit in response to detecting the hardware defect within the integrated circuit.

Example 24 is the integrated circuit of any one of examples 21-23, further optionally comprising: means for asserting a self-diagnostic failure flag in response to determining that the type of hardware defect is unrepairable.

Example 25 is the integrated circuit of any one of examples 21-23, wherein the means for performing in-field testing is optionally either formed on the integrated circuit or external to the integrated circuit.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
   programmable logic circuitry; and
   a test processor configured to perform in-field testing to detect a hardware defect in the programmable logic circuitry and to determine whether the detected hardware defect in the programmable logic circuitry is capable of being repaired,
   wherein the test processor determines a type of the hardware defect in the programmable logic circuitry, and wherein the test processor determines if the type of the hardware defect is electrical overstress or a fabrication defect.

2. The integrated circuit of claim 1, wherein the test processor sources test vectors for testing the programmable logic circuitry without receiving test signals from an external test host.

3. The integrated circuit of claim 1, wherein the test processor is further configured to selectively repair the detected hardware defect in the programmable logic circuitry by disabling and bypassing a block that includes the defect while engaging a redundant block that is previously unused.

4. The integrated circuit of claim 1, wherein the test processor repairs the detected hardware defect by bypassing a defective component and switching into use a redundant component.

5. The integrated circuit of claim 1, wherein the test processor repairs the detected hardware defect via a software redundancy scheme.

6. The integrated circuit of claim 1, wherein the test processor determines if the type of the hardware defect that is detected is delamination of a layer of the integrated circuit, a package-level defect, a factory error, or a software error.

7. The integrated circuit of claim 1, wherein the test processor is further configured to perform in-field testing to detect a hardware defect in input-output circuitry.

8. The integrated circuit of claim 1, wherein the programmable logic circuitry includes lookup table circuits and digital signal processing circuits.

9. The integrated circuit of claim 1, wherein the test processor is further configured to perform in-field testing to detect a hardware defect in configuration memory.

10. The integrated circuit of claim 1, wherein the test processor is further configured to perform in-field testing to detect a hardware defect in transceiver circuitry.

11. A method of testing an integrated circuit, the method comprising:
    with a test processor, performing in-field testing to detect a hardware defect in programmable logic circuitry within the integrated circuit; and
    with the test processor, determining the type of the hardware defect in the programmable logic circuitry, wherein the test processor determines if the type of the hardware defect is a factory error, a software error, or electrical overstress.

12. The method of claim 11, further comprising:
    in response to detecting the hardware defect within the integrated circuit, selectively repairing the detected hardware defect in the programmable logic circuitry by engaging a hardware redundancy mechanism to bypass the detected hardware defect in the programmable logic circuitry in response to determining that the type of hardware defect is repairable.

13. The method of claim 11, further comprising:
    in response to detecting the hardware defect within the integrated circuit, selectively repairing the detected hardware defect in the programmable logic circuitry by engaging a software redundancy mechanism to restore system-level functionality by loading a new configuration file onto the integrated circuit.

14. The method of claim 11, further comprising:
asserting a self-diagnostic failure flag in response to determining that the type of the hardware defect is unrepairable.

15. The method of claim 11, wherein the test processor is either formed on the integrated circuit or external to the integrated circuit.

16. A non-transitory computer-readable storage medium comprising instructions for:
detecting a hardware defect on an integrated circuit die;
determining if a type of the hardware defect is a defect in input-output circuitry, logic circuitry, or memory circuitry on the integrated circuit die; and
generating a failure mechanism report listing the type of the hardware defect that is detected.

17. The non-transitory computer-readable storage medium of claim 16, wherein the instructions for detecting the hardware defect comprise instructions for:
directing an embedded test processor on the integrated circuit die to screen for hardware faults on the integrated circuit die; and
selectively repairing the hardware faults.

18. The non-transitory computer-readable storage medium of claim 17, wherein the instructions for directing the embedded test processor to screen for the hardware faults comprise instructions for directing the embedded test processor to screen for hardware faults associated with the input-output circuitry, the logic circuitry, and the memory circuitry on the integrated circuit die.

19. The non-transitory computer-readable storage medium of claim 17, wherein the instructions for directing the embedded test processor to screen for hardware faults comprise instructions for creating and monitoring test vectors on the integrated circuit die.

20. The non-transitory computer-readable storage medium of claim 17, wherein the instructions for selectively repairing the hardware faults comprise instructions for:
determining whether the hardware faults are repairable;
bypassing defective components while switching into use redundant components in response to determining that the hardware faults are repairable; and
outputting an error alert in response to determining that the hardware faults are unrepairable.

\* \* \* \* \*